United States Patent
Uto et al.

(10) Patent No.: US 9,871,161 B2
(45) Date of Patent: Jan. 16, 2018

(54) METHOD FOR MAKING CRYSTALLINE SILICON-BASED SOLAR CELL, AND METHOD FOR MAKING SOLAR CELL MODULE

(71) Applicant: KANEKA CORPORATION, Osaka (JP)

(72) Inventors: Toshihiko Uto, Osaka (JP); Daisuke Adachi, Osaka (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 15/473,045

(22) Filed: Mar. 29, 2017

(65) Prior Publication Data

US 2017/0200852 A1  Jul. 13, 2017

Related U.S. Application Data

(63) Continuation of application No. PCT/JP2015/077769, filed on Sep. 30, 2015.

(30) Foreign Application Priority Data

Sep. 30, 2014 (JP) ................................ 2014-202430

(51) Int. Cl.
*H01L 31/0236* (2006.01)
*H01L 31/0747* (2012.01)
(Continued)

(52) U.S. Cl.
CPC ...... *H01L 31/1804* (2013.01); *H01L 31/0236* (2013.01); *H01L 31/0747* (2013.01); *H01L 31/202* (2013.01); *Y02E 10/50* (2013.01)

(58) Field of Classification Search
CPC ........................ H01L 31/0236; H01L 31/0747
See application file for complete search history.

(56) References Cited

U.S. PATENT DOCUMENTS 6,207,890 B1 * 3/2001 Nakai ............. H01L 31/035281
136/246
2001/0029978 A1 10/2001 Nakai et al.
(Continued)

FOREIGN PATENT DOCUMENTS

JP        3271990 B2    4/2002
JP     2013518425 A    5/2013
(Continued)

OTHER PUBLICATIONS

International Preliminary Report on Patentability issued in International Application No. PCT/JP2015/077769 dated Apr. 13, 2017 (9 pages).
(Continued)

*Primary Examiner* — Benjamin Sandvik
*Assistant Examiner* — Farid Khan
(74) *Attorney, Agent, or Firm* — Osha Liang LLP

(57) ABSTRACT

A manufacturing method includes steps of forming a texture on a surface of a single-crystalline silicon substrate, cleaning the surface of the single-crystalline silicon substrate using ozone, depositing an intrinsic silicon-based layer on the texture on the single-crystalline silicon substrate, and depositing a conductive silicon-based layer on the intrinsic silicon-based layer, in this order. The single-crystalline silicon substrate before deposition of the intrinsic silicon-based layer has a texture size of less than 5 μm. A recess portion of the texture has a curvature radius of less than 5 nm. After deposition of at least a part of the intrinsic silicon-based layer and before deposition of the conductive silicon-based layer, the intrinsic silicon-based layer is subjected to a plasma treatment in an atmosphere of a gas mainly composed of hydrogen.

12 Claims, 2 Drawing Sheets

(51) Int. Cl.
*H01L 31/18* (2006.01)
*H01L 31/20* (2006.01)

(56) References Cited

U.S. PATENT DOCUMENTS

| | | | | |
|---|---|---|---|---|
| 2012/0212819 A1* | 8/2012 | Takano | ............ | B29D 11/00269 |
| | | | | 359/558 |
| 2012/0288985 A1* | 11/2012 | Moriceau | .......... | H01L 21/30604 |
| | | | | 438/87 |
| 2013/0203210 A1* | 8/2013 | Uto | .................... | H01L 31/1804 |
| | | | | 438/96 |
| 2013/0210185 A1* | 8/2013 | Yoshimi | .............. | H01L 31/1804 |
| | | | | 438/57 |
| 2013/0312826 A1* | 11/2013 | Narita | ............. | H01L 31/022425 |
| | | | | 136/256 |
| 2015/0228814 A1* | 8/2015 | Matsuyama | .... | H01L 31/022466 |
| | | | | 136/256 |
| 2015/0372165 A1* | 12/2015 | Harada | ............. | H01L 31/02363 |
| | | | | 136/256 |
| 2015/0372166 A1* | 12/2015 | Tsunomura | ....... | H01L 31/02363 |
| | | | | 136/256 |
| 2016/0072000 A1* | 3/2016 | Smith | ................. | H01L 31/1804 |
| | | | | 136/258 |
| 2016/0233368 A1* | 8/2016 | Ogane | ................. | H01L 31/0747 |

FOREIGN PATENT DOCUMENTS

| | | |
|---|---|---|
| JP | 2014130943 A | 7/2014 |
| WO | 2009120631 A2 | 10/2009 |
| WO | 2012043124 A1 | 4/2012 |
| WO | 2014064929 A1 | 5/2014 |

OTHER PUBLICATIONS

International Search Report issued in International Application No. PCT/JP2015/077769; dated Dec. 15, 2015 (2 pages).

* cited by examiner

METHOD FOR MAKING CRYSTALLINE SILICON-BASED SOLAR CELL, AND METHOD FOR MAKING SOLAR CELL MODULE

TECHNICAL FIELD

One or more embodiments of the present invention relate to a method for manufacturing crystalline silicon-based solar cell and method for manufacturing solar cell module.

BACKGROUND

A crystalline silicon-based solar cell in which a conductive amorphous silicon-based layer having a band gap different from that of a single-crystalline silicon is formed on a surface of the single-crystalline silicon substrate is called heterojunction solar cell. Among heterojunction solar cells, a solar cell having an intrinsic amorphous silicon thin-film between a conductive amorphous silicon-based layer and a single-crystalline silicon substrate provides a crystalline silicon-based solar cell with a high conversion efficiency.

In crystalline silicon-based solar cells such as heterojunction solar cells, tetragonal pyramid shaped (pyramid-shaped) irregularities structures called textures are often formed on a surface of a crystalline silicon substrate. When textures are formed on a substrate surface, light incident to a crystalline silicon substrate is scattered, and therefore the optical path length in the crystalline silicon substrate increases, so that current density of a solar cell is increased.

After formation of textures on a surface of a crystalline silicon substrate and before formation of an amorphous silicon-based layer on the crystalline silicon substrate, several kinds of treatments are performed in order to adjust a texture shape and clean the surface. For example, Patent Document 1 and Patent Document 2 disclose that after pyramid-shaped textures are formed on a surface of a crystalline silicon substrate by anisotropic etching and before a surface cleaning treatment is performed, the substrate is immersed in an alkali or an oxidizing aqueous solution to isotropically etch the substrate surface, so that sharp portions of textures are removed to round valley portions (recess portions). Patent Document 2 proposes a method in which a substrate is immersed in ozone water, and then immersed in a hydrofluoric acid aqueous solution to remove an oxide film formed by ozone oxidation as a method for cleaning a silicon substrate after formation of textures.

PRIOR ART DOCUMENTS

Patent Documents

Patent Document 1: Japanese Patent Publication No. 3271990

Patent Document 2: International Publication No. WO 2009/120631

Patent Documents 1 and 2 describe that when sharp portions of textures on a crystalline silicon substrate are removed to round recess portions, the thickness of an intrinsic silicon-based layer formed on the textures becomes uniform, and cracking or the like of the intrinsic silicon-based layer can be prevented, so that open circuit voltage and fill factor of a solar cell can be improved. However, when the recess portions of textures are round, the reflectivity increases, leading to a decrease in short circuit current. Accordingly, the effect of improving open circuit voltage and fill factor is canceled by a decrease in short circuit current, and thus it is difficult to improve the conversion efficiency of a solar cell.

SUMMARY

One or more embodiments of the present invention provide a crystalline silicon-based solar cell, in which textures are formed on a substrate surface and an intrinsic silicon-based layer are provided thereon, having an improved open circuit voltage, fill factor and short circuit current and having high conversion efficiency.

One or more embodiments of the present invention relate to a method for manufacturing a crystalline silicon-based solar cell that includes an intrinsic silicon-based layer, a conductive silicon-based layer and a transparent electroconductive layer in this order on one principal surface of a single-crystalline silicon substrate. The method for manufacturing a crystalline silicon-based solar cell according to one or more embodiments of the present invention includes the steps of forming textures on a surface of a single-crystalline silicon substrate; cleaning the surface of the single-crystalline silicon substrate using ozone; depositing an intrinsic silicon-based layer on the textures on the single-crystalline silicon substrate; and depositing a conductive silicon-based layer on the intrinsic silicon-based layer, in this order. The size of the texture before deposition of the intrinsic silicon-based layer is less than 5 µm.

In the manufacturing method of crystalline silicon-based solar cell according to one or more embodiments of the present invention, textures are formed on a substrate surface by anisotropic etching, and then the substrate surface is cleaned using ozone. It is possible that after formation of textures, the substrate surface be cleaned using ozone without performing an isotropic etching treatment for rounding the recess portions of textures. By cleaning the substrate surface using ozone, the sharp shape of textures formed by anisotropic etching is retained, and thus the recess portions of textures are not excessively rounded. Specifically, the recess portions of textures before deposition of the intrinsic silicon-based layer can be made to have a curvature radius of less than 5 nm.

In the manufacturing method of crystalline silicon-based solar cell according to one or more embodiments of the present invention, the intrinsic silicon-based layer is subjected to a plasma treatment (hereinafter, also referred to as a "hydrogen plasma treatment") in an atmosphere of a gas mainly composed of hydrogen, for example, above 50%, 60%, 70%, 80%, 90%, 95%, or 99%, after deposition of at least a part of the intrinsic silicon-based layer and before deposition of a conductive silicon-based layer. By subjecting the intrinsic silicon-based layer to the hydrogen plasma treatment, the passivation effect of the single-crystalline silicon substrate is improved, so that defects at the interface between the single-crystalline silicon substrate and the intrinsic silicon-based layer can be reduced.

The defects may occur more easily in the recess portion of the texture than in the projection portion of the texture due to compressive stress etc. in deposition of an intrinsic silicon-based layer. In one or more embodiments of the present invention, the texture size of the silicon substrate is as small as less than 5 µm. Therefore non-uniformity of the thickness of the intrinsic silicon-based layer formed on textures and occurrence of defects can be suppressed even if the recess portions are not rounded. Since textures are small, the intrinsic silicon-based layer formed on the recess portions of textures can be subjected to the hydrogen plasma treatment sufficiently. In other words, defects at the interface between the single-crystalline silicon substrate and the intrinsic silicon-based layer can be further reduced, since the intrinsic silicon-based layer can be subjected to the hydrogen plasma treatment uniformly. Therefore, open circuit voltage and fill factor can be remarkably improved by the hydrogen plasma treatment.

Further, one or more embodiments of the present invention relate to a method for manufacturing a solar cell module, the method including connecting a plurality of crystalline silicon-based solar cells manufactured by the methods disclosed in the present disclosure, and sealing the crystalline silicon-based solar cells with a sealing material.

According to one or more embodiments of the present invention, a crystalline silicon-based solar cell having an improved open circuit voltage, fill factor and short circuit current and having high conversion efficiency can be provided.

DETAILED DESCRIPTION OF EMBODIMENTS

Figure 1:
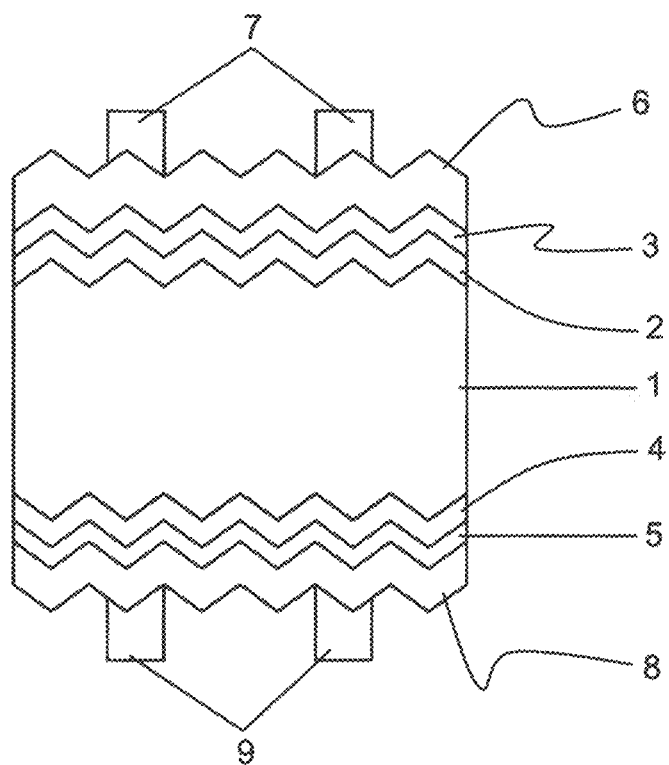
FIG. 1 is a schematic sectional view of a crystalline silicon-based solar cell according to one or more embodiments of the present invention.

Hereinafter, one or more embodiments of the present invention will be described in detail with reference to drawings. FIG. 1 is a schematic sectional view of a crystalline silicon-based solar cell according to one or more embodiments. Crystalline silicon-based solar cell shown in FIG. 1 is a heterojunction solar cell in which a first intrinsic silicon-based layer 2 is formed on one principal surface of a single-crystalline silicon substrate 1, and a second intrinsic silicon-based layer 4 is formed on the other principal surface of the single-crystalline silicon substrate 1. A p-type silicon-based layer 3 and an n-type silicon-based layer 5 are formed on surfaces of the first intrinsic silicon-based layer 2 and the second intrinsic silicon-based layer 4, respectively. A first transparent electroconductive layer 6 and a second transparent electroconductive layer 8 are formed on surfaces of the p-type silicon-based layer 3 and the n-type silicon-based layer 5, respectively. A collecting electrode is formed on at least a transparent electroconductive layer on the light incident side. In FIG. 1, collecting electrodes 7 and 9 are on both the light incident side and the back side. In the present disclosure, the p-type silicon-based layer and the n-type silicon-based layer are each referred to as a "conductive silicon-based layer" when they are not particularly discriminated.

In one or more embodiments, single-crystalline silicon substrates are prepared by slicing a silicon ingot, which is prepared by, for example, a Czochralski method, to a predetermined thickness using a wire-saw or the like. The single-crystalline silicon substrate 1 for use in one or more embodiments of the present invention is a single-crystalline silicon substrate of first conductivity-type. The single-crystalline silicon substrate of first conductivity-type contains an impurity which supplies charges to silicon, and thus is conductive. The "first conductivity-type" in this disclosure means being one of an n-type and a p-type. Single-crystalline silicon substrates containing a conductive impurity include n-type single-crystalline silicon substrates containing an impurity (e.g., phosphorus atom) which introduces an electron to an Si atom; and p-type single-crystalline silicon substrates containing an impurity (e.g., boron atom) which introduces a hole to an Si atom.

In one or more embodiments, when a single-crystalline silicon substrate of first conductivity-type is used in a heterojunction solar cell, a heterojunction on the light incident side where light incident to the single-crystalline silicon substrate is most absorbed may be a reverse junction. When the heterojunction on the light incident side is a reverse junction, a strong electric field is provided, so that electron/hole pairs are effectively separated and collected. When comparing hole and electron, electron, which has a lower effective mass and scattering cross-sectional area, generally has a high mobility. Accordingly, the single-crystalline silicon substrate 1 of first conductivity-type may be an n-type single-crystalline silicon substrate.

An example of the structure of the heterojunction solar cell, when an n-type single-crystalline silicon substrate is used, is a structure including a collecting electrode 7, a transparent electroconductive layer 6, a p-type silicon-based layer 3, an intrinsic silicon-based layer 2, an n-type single-crystalline silicon substrate 1, an intrinsic silicon-based layer 4, an n-type silicon-based layer 5, a transparent electroconductive layer 8, and a collecting electrode 9, in this order from the light incident side. In this configuration, the n-type silicon-based layer (also referred to as an n layer) side may be a back side.

In the manufacturing method according to one or more embodiments of the present invention, textures (irregularity structures) are formed on a surface of a single-crystalline silicon substrate. For forming textures on the surface, it is possible that the single-crystalline silicon substrate be cut so as to have the (100) surface as an incident surface. On the single-crystalline silicon substrate cut along the (100) surface, textured structures can be easily formed by anisotropic etching which makes use of a difference between etching rates on the (100) surface and the (111) surface.

Textures can be formed by anisotropic etching in which the single-crystalline silicon substrate is immersed in an etchant containing an alkali and an additive for anisotropic etching. Examples of the alkali include but are not limited to sodium hydroxide and potassium hydroxide. The additive for anisotropic etching is added for preventing a hydrogen gas, which is produced during reaction in anisotropic etching, from sticking to the single-crystalline silicon substrate. As the additive for anisotropic etching, one that acts to reduce the surface tension may be used, and examples thereof include but are not limited to alcohols such as isopropyl alcohol (2-propanol), and surfactants.

Generally, the size of the texture on a substrate surface tends to increase as etching progresses. For example, a method of increasing the alkali concentration of an etchant or elevating the etching temperature increases the etching rate, so that etching further progresses. Etching progresses as the etching time is increased. By changing the type of the additive for anisotropic etching or adjusting the addition amount of the additive for anisotropic etching, the size of the texture can be adjusted.

In one or more embodiments of the present invention, the size of the texture before deposition of the intrinsic silicon-based layer on the silicon substrate is less than 5 µm as described later. In the ozone treatment as described later, the size of the texture is hardly changed, and therefore the size of the texture formed by anisotropic etching may be less than 5 µm.

In one or more embodiments, after textures are formed on a surface of the single-crystalline silicon substrate, the substrate surface is subjected to a cleaning treatment using ozone (hereinafter, also referred to as ozone treatment). In one or more embodiments of the present invention, it is possible that after textures are formed by anisotropic etching, the ozone treatment be performed without performing a treatment for rounding the recess portions of textures by isotropic etching or the like. Typical examples of isotropic etching for rounding the recess portions of textures include but are not limited to a treatment using an oxidizing aqueous solution such as a mixed solution of hydrofluoric acid and nitric acid, and a treatment using an alkali solution that does not contain an anisotropic etching additive.

In one or more embodiments, the ozone treatment is performed by bringing an ozone-containing solution into contact with the single-crystalline silicon substrate. Examples of the ozone treatment method include but are not limited to a method in which a single-crystalline silicon substrate after formation of textures is immersed in an ozone-containing solution, and a method in which an ozone-containing solution is sprayed to a surface of a single-crystalline silicon substrate after formation of textures. Exemplary methods include, a method in which a single-crystalline silicon substrate is immersed in an ozone-containing solution, and a method in which a single-crystalline silicon substrate is immersed in an ozone aqueous solution.

In one or more embodiments, by the ozone treatment, a substrate surface is oxidized to form an oxide film, and impurities (e.g., organic substances such as oil) etc. deposited on the substrate surface are captured in the oxide film. The oxide film is removed by etching or the like to clean the substrate surface.

When the ozone treatment is performed using an ozone-containing solution, the ozone concentration may be 1 to 50 ppm, 5 to 20 ppm, or 5 to 15 ppm. When the ozone concentration is 1 ppm or more, a high cleaning effect is obtained. When the ozone concentration is 50 ppm or less, an oxide film formed on a substrate surface does not have an excessively large thickness. Thus, even when the oxide film is removed by a hydrofluoric acid treatment or the like after the ozone treatment, non-oxidized portions of the substrate surface just below the oxide film are hardly etched, so that the valley portions of textures are not excessively rounded, and therefore a decrease in current density due to an increase in reflectivity can be prevented.

The ozone treatment temperature is not particularly limited, and it is, for example, about 20 to 30° C. In the case of an ozone treatment using an ozone-containing solution, the ozone treatment temperature means the temperature of the ozone-containing solution. The ozone treatment time (e.g., substrate immersion time) may be appropriately determined and/or adjusted with consideration given to an ozone concentration, a temperature and so on, and it is, for example, about 5 to 30 minutes. In the case of an ozone treatment using an ozone-containing solution, the ozone treatment time means a time during which the substrate is immersed in the ozone-containing solution.

It is possible that after the ozone treatment, the substrate surface be etched for removing the oxide film. For etching of the substrate surface, an aqueous solution containing hydrofluoric acid (HF) may be used. By, for example, an etching treatment using hydrofluoric acid (hereinafter, also referred to as a "hydrofluoric acid treatment"), impurities on the substrate surface can be removed together with the oxide film.

In one or more embodiments, the hydrofluoric acid treatment is performed by bringing a hydrofluoric acid-containing solution into contact with the single-crystalline silicon substrate. The hydrofluoric acid-containing solution may be an aqueous solution. The aqueous solution may contain nitric acid, sulfuric acid, hydrogen peroxide and so on in addition to hydrofluoric acid. Examples of the hydrofluoric acid treatment method include a method in which a single-crystalline silicon substrate is immersed in a hydrofluoric acid-containing solution, and a method in which a hydrofluoric acid-containing solution is sprayed to a surface of a single-crystalline silicon substrate. An example is a method in which a single-crystalline silicon substrate is immersed in a hydrofluoric acid-containing solution.

When the hydrofluoric acid treatment is performed, the hydrofluoric acid concentration may be 1 to 10% by weight, 1.5 to 5% by weight, or 2 to 5% by weight, in view of removing the oxide film. The hydrofluoric acid treatment temperature is not particularly limited, and it is, for example, about 20 to 30° C. The hydrofluoric acid treatment time is, for example, about 1 to 5 minutes.

Figure 2:
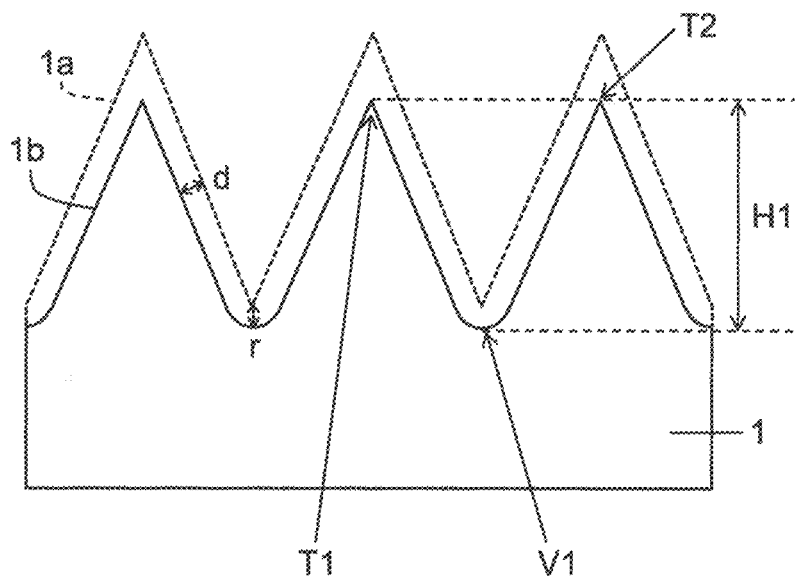
FIG. 2 is a schematic sectional view of an example of texture formed on a surface of single-crystalline silicon substrate according to one or more embodiments of the present invention.

FIG. 2 shows one example of a shape of textures formed on a surface of the single-crystalline silicon substrate. Textures on the single-crystalline silicon substrate may be continuously formed as shown in FIG. 2 for obtaining sufficient light scattering property. When textures are discontinuous, the light scattering property tends to be deteriorated. The phrase "textures are continuous" in the present disclosure means a state in which textures have substantially no flat portion, and projection portions are adjacent to one another.

In one or more embodiments of the present invention, the size of the texture on the surface of the single-crystalline silicon substrate before deposition of the intrinsic silicon-based layer is less than 5 µm. In other words, the size of the texture after performing an ozone treatment, and a hydrofluoric acid treatment etc. as necessary is less than 5 µm. Since the texture size is small, cracking, chipping and so on of the substrate can be suppressed even when the single-crystalline silicon substrate has a small thickness. Even when the peak of the projection portion and the valley of the recess portion of the texture have a sharp shape, local stress hardly occurs in the intrinsic silicon-based layer formed on textures, and the intrinsic silicon-based layer hardly has a difference between the thicknesses on the projection portion and the recess portion as long as the texture size is small. Thus, a high passivation effect from the intrinsic silicon-based layer is maintained, so that a solar cell having a high fill factor and open circuit voltage is obtained.

The size of the texture may be less than 4 µm, or less than 3.5 µm. As long as the reflectivity is not excessively increased, the lower limit of the size of the texture is not limited, and it may be, for example, 1 µm or more.

In one or more embodiments, the size of the texture on the surface of the single-crystalline silicon substrate is determined from a height difference between the peak of the projection portion and the valley of the recess portion. As shown in FIG. 2, the size H1 of the texture is defined by a distance between a line connecting peaks T1 and T2 of projection portions of adjacent irregularity structures, respectively and a valley V1 of a recess portion between both the peaks.

The size of the texture can be determined by measuring the surface shape of the substrate using an atomic force microscope (AFM). Specifically, the height difference H1 is determined by scanning the surface of the single-crystalline silicon substrate over a range of about 40 μm×40 μm with the atomic force microscope to measure the surface shape. The height difference H1 may be calculated from a distance between a straight line T1-T2 and V1 where T1 is a peak of a projection portion of a texture, which is randomly selected from the measured surface shape (AFM image), T2 is a peak of a projection portion of one texture adjacent to the peak T1, and V1 is a valley of a recess portion between the peaks T1 and T2. When there is a distribution in the sizes of textures, height differences at 20 spots are calculated, and the average thereof is determined, and defined as the size H1 of the texture.

In one or more embodiments, when a hydrofluoric acid treatment or the like is performed after the ozone treatment, the single-crystalline silicon substrate 1 provided with textures is etched by a thickness d from a surface 1a to a surface 1b as shown in FIG. 2. As a result, a curved surface having a curvature radius r is formed in the recess portion of the texture. According to one or more embodiments of the present invention, the curvature radius r is almost equal to the etching thickness d.

In one or more embodiments, the thickness of the oxide film formed on the substrate surface by the ozone treatment is about 0.5 to 4.5 nm (usually about 1 to 2 nm). Thus, when isotropic etching is not performed before the ozone treatment, the curvature radius of the recess portion after removal of the oxide film using hydrofluoric acid or the like after the ozone treatment is about 0.5 to 4.5 nm. Accordingly, in one or more embodiments of the present invention, the recess portion is not excessively rounded.

The curvature radius of the recess portion of the texture can be determined by observing a cross-section shape of the substrate using a transmission electron microscope (TEM). From an observation image (TEM image) of the recess portion of the texture, the shape of an area in the vicinity of the recess portion is approximated with an arc of an imaginary circle. The radius of the imaginary circle here may be defined as a curvature radius. The imaginary circle can be determined by a method in which a boundary is defined by subjecting an observation image of a cross-section to a monochromatic binarization treatment, and on the basis of the coordinates of the boundary in the vicinity of a recess portion, central coordinates and a radius are calculated by a least squares method. When there is a distribution in the curvature radii of recess portions of textures, curvature radii at 20 spots are calculated, and the average thereof is determined, and defined as the curvature radius of the recess portion of the texture.

In one or more embodiments of the present invention, the curvature radius of the recess portion of the texture before deposition of the intrinsic silicon-based layer (i.e., the texture after performing an ozone treatment, and a hydrofluoric acid treatment or the like as necessary) may be less than 5 nm. The curvature radius of the recess portion of the texture may be less than 3 nm, or less than 2.5 nm. The lower limit of the curvature radius of the recess portion of the texture is not particularly limited, and it may be, for example, 0.1 nm or more.

In one or more embodiments, after formation of textures by anisotropic etching, an intrinsic silicon-based layer is deposited on the single-crystalline silicon substrate subjected to an ozone treatment, and a hydrofluoric acid treatment as necessary. In production of the crystalline silicon-based solar cell shown in FIG. 1, the first intrinsic silicon-based layer 2 and the p-type silicon-based layer 3 are formed on one principal surface of the single-crystalline silicon substrate 1, and the second intrinsic silicon-based layer 4 and the n-type silicon-based layer 5 are formed on the other principal surface of the single-crystalline silicon substrate 1. As a deposition method for these silicon-based layer, a plasma-enhanced chemical vapor deposition (CVD) method may be used. When the silicon-based layers are deposited by a plasma-enhanced CVD method in the case where a hydrogen plasma treatment as described later is performed, the production process can be simplified because deposition of the silicon-based layer and the hydrogen plasma treatment can be performed in the same chamber.

Deposition conditions used for forming the silicon-based layers by a plasma-enhanced CVD method may be, for example, as follows: a substrate temperature of 100 to 300° C.; a pressure of 20 to 2600 Pa; and a high-frequency power density of 0.003 to 0.5 W/cm$^2$. A raw material gas used to form the silicon-based layers may be a silicon-containing gas such as $SiH_4$ or $Si_2H_6$, or a mixed gas of silicon-based gas and $H_2$. A dopant gas for forming the p-layer or n-layer may be, for example, $B_2H_6$ or $PH_3$. The amount of impurity such as P or B added, in this case, is sufficient to be a trace amount; thus, a mixed gas wherein a dopant gas is beforehand diluted with the raw material gas, $H_2$ or the like may be used. A gas containing a different element, such as $CH_4$, $CO_2$, $NH_3$ or $GeH_4$, may be added to the aforementioned gas to form a silicon alloy layer, such as silicon carbide, silicon nitride and silicon germanium, as the silicon-based layer.

In one or more embodiments, the intrinsic silicon-based layers 2 and 4 are non-doped substantially intrinsic silicon-based thin-films. The intrinsic silicon-based layers 2 and 4 may be non-doped hydrogenated amorphous silicon consisting essentially of silicon and hydrogen. When intrinsic silicon-based layers 2 and 4 are formed on each surface of the single-crystalline silicon substrate, surface passivation can be effectively performed while suppressing diffusion of impurities to the single-crystalline silicon substrate during deposition of the conductive silicon layer (p-type or n-type silicon-based layer). When the amount of hydrogen in the intrinsic silicon-based layer is changed in the thickness direction, the layer may have an energy gap profile effective for collecting carriers.

The thickness of the intrinsic silicon-based layers 2 and 4 may be in a range of 3 to 16 nm, in a range of 4 to 14 nm, or in a range of 5 to 12 nm. If the thickness of the intrinsic silicon-based layer is excessively small, interface defects tends to be increased due to diffusion of impurity atoms in the conductive silicon-based layers 3 and 5 to the single-crystalline silicon substrate surface or deterioration of surface coverage of the single-crystalline silicon substrate. On the other hand, if the thickness of the intrinsic silicon-based layers is excessively large, the conversion characteristics may be deteriorated due to an increase in resistance or an increase in loss of light by absorption.

In the manufacturing method according to one or more embodiments of the present invention, the intrinsic silicon-based thin film is subjected to a plasma treatment (hydrogen plasma treatment) in an atmosphere of a gas containing hydrogen as a main component. When an intrinsic silicon-based layer formed on a surface of a silicon substrate having textures having a small size and a small recess portion curvature radius is subjected to a hydrogen plasma treatment, the conversion characteristics, for example, open circuit voltage and fill factor, of the solar cell are considerably improved.

Examples of the method for subjecting the intrinsic silicon-based layer to a hydrogen plasma treatment include a method in which a hydrogen plasma treatment is performed after deposition of an intrinsic silicon-based layer and before deposition of a conductive silicon-based layer; and a method in which deposition of an intrinsic silicon-based layer is temporarily stopped in the middle, a hydrogen plasma treatment is then performed, and deposition of the intrinsic silicon-base layer is then resumed. Examples include a method in which deposition of an intrinsic silicon-based layer is temporarily stopped in the middle, a hydrogen plasma treatment is then performed, and deposition of the intrinsic silicon-base layer is then resumed. In this case, the thickness of the intrinsic silicon-based layer deposited before and after the hydrogen plasma treatment is adjusted so that the total thickness of the intrinsic silicon-based layer deposited before and after the hydrogen plasma treatment falls within the above-mentioned range (e.g., 3 to 16 nm). For example, the intrinsic silicon-based layer is deposited to have a thickness of 1 to 10 nm, the hydrogen plasma treatment is then performed, and deposition of the intrinsic silicon-based layer is resumed to form the intrinsic silicon-based layer in a thickness of 1 to 15 nm. The intrinsic silicon-based layer may be deposited to have a thickness equivalent to 40 to 60% of the total thickness, the hydrogen plasma treatment may be then performed, and a supplementary thickness part is then deposited. After the supplementary thickness part of the intrinsic silicon-based layer is deposited following to the hydrogen plasma treatment, a hydrogen plasma treatment may be further performed before deposition of the conductive silicon-based layer.

As conditions for the hydrogen plasma treatment, for example, the substrate temperature and the pressure are, for example, 100 to 300° C. and 20 to 2600 Pa, respectively. The high-frequency power density in the hydrogen plasma treatment and the hydrogen plasma treatment time can be appropriately set within a range which ensures that an effect of improving conversion efficiency by the hydrogen plasma treatment is obtained.

The "atmosphere of a gas containing hydrogen as a main component" in the hydrogen plasma treatment step may contain an inert gas such as nitrogen, helium or argon, and may contain a very small amount of a dopant gas such as $B_2H_6$ or $PH_3$, as long as the concentration of hydrogen in the atmosphere is 70% by volume or more. During the hydrogen plasma treatment, a raw material gas such as $SiH_4$ may not be introduced in the chamber. In addition that no raw material gas is introduced, it is possible that raw material gas used in deposition of the intrinsic silicon-based layer does not remain in the chamber during the hydrogen plasma treatment. Even if the raw material gas is contained in the gas atmosphere during the hydrogen plasma treatment, concentration of the raw material gas may be small enough so that the silicon-based layer is not substantially deposited during plasma discharge. The acceptable limit of the content of the raw material gas during the hydrogen plasma treatment depends on other deposition parameters, but may be $\frac{1}{100}$ or less, $\frac{1}{500}$ or less, or $\frac{1}{2000}$ or less of the content of hydrogen on a volume basis.

The intrinsic silicon-based layer may be non-doped hydrogenated amorphous silicon as described previously, but a part of the intrinsic silicon-based layer may be crystallized by the hydrogen plasma treatment even when amorphous silicon is deposited as the intrinsic silicon-based layer. Presence of a crystallized component can be confirmed by, for example, cross-sectional observation of a sample with a high-resolution transmission electron microscope (TEM), X-ray diffractometry, Raman scattering spectroscopy or the like.

Formation of the intrinsic silicon-based layer and the hydrogen plasma treatment may be carried out successively in the same deposition chamber. Plasma discharge may be stopped temporarily after formation of the intrinsic silicon-based layer and before starting the hydrogen plasma treatment. Specifically, it is possible that supply of a raw material gas is stopped after the plasma discharge is stopped so that the inside of the chamber is adjusted to an atmosphere under a gas containing hydrogen as a main component, and thereafter the discharge is resumed to start the hydrogen plasma treatment.

In one or more embodiments, hydrogen plasma treatment is performed on the intrinsic silicon-based layer on a surface that is provided with textures and subjected to an ozone treatment. When both surfaces of the silicon substrate are provided with textures and subjected to an ozone treatment, one or both of the first intrinsic silicon-based layer 2 and the second intrinsic silicon-based layer 4 may be subjected to the hydrogen plasma treatment. When both the first intrinsic silicon-based layer 2 and the second intrinsic silicon-based layer 4 are subjected to the hydrogen plasma treatment, an additional conversion efficiency improving effect can be obtained.

The methods for forming the p-type silicon-based layer 3 on the first intrinsic silicon-based layer 2 and forming the n-type silicon-based layer 5 on the second intrinsic silicon-based layer 4 are not particularly limited. As the p-type or n-type silicon-based layer, a hydrogenated amorphous silicon layer, an oxidized amorphous silicon layer, an amorphous silicon carbide layer or the like is deposited. In addition to an amorphous layer, a microcrystalline layer that partially contains a crystalline component may be formed.

In one or more embodiments of the present invention, the total thickness of the intrinsic silicon-based layer and the conductive silicon-based layer may be smaller on the recess portion of the texture than on the projection portion of the texture. It is possible that the relationship of $t_a < t_b$ be satisfied, and it is also possible that the relationship of $0.9t_b \leq t_a < t_b$ be satisfied, wherein $t_a$ is the total thickness of the intrinsic silicon-based layer and the conductive silicon-based layer on the recess portion, and $t_b$ is the total thickness of the intrinsic silicon-based layer and the conductive silicon-based layer on the projection portion. When the size of the texture is less than 5 μm, the difference between the total thickness of the intrinsic silicon-based layer and the conductive silicon-based layer on the projection portion and the total thickness of the intrinsic silicon-based layer and the conductive silicon-based layer on the recess portion can be reduced.

The first transparent electroconductive layer 6 and the second transparent electroconductive layer 8 are formed on the p-type silicon-based layer 3 and the n-type silicon-based layer 5, respectively. The thickness of the first and the second transparent electroconductive layers may be 10 nm or more and 140 nm or less from the viewpoints of transparency and electroconductivity. As the transparent electroconductive layer, a thin-film formed of a transparent conductive metal oxide, for example, indium oxide, tin oxide, zinc oxide, titanium oxide or a complex oxide thereof is generally used. An examples includes, an indium-based complex oxide having indium oxide as a main component. From the viewpoints of high electroconductivity and transparency, an indium tin complex oxide (ITO) may be used.

Both the first transparent electroconductive layer and the second transparent electroconductive layer can be deposited by a known method. Examples of the deposition method include a sputtering method, an ion plating method, a metal organic chemical vapor deposition (MOCVD) method, a thermal CVD method, a plasma-enhanced CVD method, a molecular-beam epitaxy (MBE) method and a pulse laser deposition (PLD) method. For example, the sputtering method is suitable for deposition of an indium-based complex oxide layer of ITO or the like.

In one or more embodiments of the present invention, the thickness of the transparent electroconductive layer may be smaller on the recess portion of the texture than on the projection portion of the texture. It is possible that the relationship of $t_c < t_d$ be satisfied, and it is also possible that the relationship of $0.9t_d \leq t_c < t_d$ be satisfied, wherein $t_c$ is the thickness of the transparent electroconductive layer on the recess portion, and $t_d$ is the thickness of the transparent electroconductive layer on the projection portion.

On the transparent electroconductive layers 6 and 8, collecting electrodes 7 and 9 are respectively formed for extracting electric current. The collecting electrode on the light incident side may be patterned in a shape of a comb-like pattern or the like for increasing the light receiving area of the solar cell. Patterned collecting electrode can be prepared by a known technique such as inkjet printing, screen printing, wire bonding or spraying. The collecting electrode on a side opposite to the light incident side may or may not be patterned. For example, a metal electrode on a side opposite to the light incident side may be formed substantially over the entire surface of the transparent electroconductive layer. In this case, the metal electrode layer may behave as a reflection layer to prevent light, which has not been absorbed into the silicon substrate, from leaking outside the cell.

Formation of a patterned collecting electrode by a printing method is performed by, for example, applying an electroconductive paste containing metallic particles and a resin binder by screen printing or the like. In one or more embodiments of the present invention, the texture size is small, and therefore seepage of the electroconductive paste during printing hardly occurs, so that reproducibility of pattern formation is improved. Thus, formation of an electrode on an undesired portion is suppressed, so that a shading loss caused by a collecting electrode can be reduced. Since the texture size is small, metallic particles in the electroconductive paste hardly enter the recess portions of textures, and the recess portions tend to be filled with a resin binder. Thus, adhesive strength between the collecting electrode and the transparent electroconductive layer can be improved.

Examples of the method for forming a patterned collecting electrode by a plating method include a method in which a patterned electrode is formed using a resist (see, for example, Japanese Patent Laid-open Publication No. 60-66426); and a method in which an opening section is formed in an insulating layer on a first electroconductive layer, and a second electroconductive layer is deposited by plating with the opening section of the insulating layer as an origination point (see, for example, Japanese Patent Publication No. 5325349). Also in these methods, patterning is performed by printing or the like in formation of a resist, formation of a first electroconductive layer, formation of an opening section in an insulating layer, and so on. In one or more embodiments of the present invention, the texture size of the silicon substrate is small, and therefore seepage during pattern formation hardly occurs, so that reproducibility of pattern formation is improved. Thus, in formation of a patterned collecting electrode by the plating method, reproducibility of pattern formation is high, so that a shading loss caused by a collecting electrode can be reduced.

When the crystalline silicon-based solar cell shown in FIG. 1 is produced, which of the first intrinsic silicon-based layer 2 and the second intrinsic silicon-based layer 4 is formed first is not limited. The order in which the first intrinsic silicon-based layer 2, the second intrinsic silicon-based layer 4, the p-type silicon-based layer 3 and the n-type silicon-based layer 5 are formed is not particularly limited as long as the crystalline silicon-based solar cell shown in FIG. 1 is produced. In one or more embodiments of the present invention, textures may be formed on a substrate surface, and subjected to an ozone treatment, followed by deposition of an intrinsic silicon-based layer and a conductive silicon-based layer on the textures subjected to the ozone treatment. It is possible that at least, textures be formed on a light incident surface, and subjected to an ozone treatment.

As described above, short circuit current of the solar cell can be improved by using a silicon substrate provided with textures having a size of less than 5 µm and having recess portions that are not rounded. When an intrinsic silicon-based layer is deposited on the textures, and after deposition of at least a part of the intrinsic silicon-based layer, by forming a hydrogen plasma treatment, the effect of improving open circuit voltage and fill factor by the hydrogen plasma treatment is remarkably improved.

The solar cell manufactured by the above may be modularized when put into practical use. Modularization of the solar cell is performed by an appropriate method. For example, by connecting collecting electrodes via an interconnector such as a TAB, a plurality of solar cells are connected in series or in parallel, and sealed by a sealing material and a glass plate to thereby perform modularization.

As a TAB electrode for connecting a plurality of cells, a TAB electrode with irregularities formed on a light incident surface as described in Japanese Patent Publication No. 4646558 may be used. When a TAB electrode having irregularities on a light incident surface is used, light reflected at the TAB electrode efficiently reenters a light-receiving surface of the solar cell. In one or more embodiments of the present invention, the light confinement effect is high because a substrate provided with small textures having recess portions that are not excessively rounded is used as described above. Therefore, combination of the TAB electrode and a solar cell produced by the method according to one or more embodiments of the present invention can be further improve light confinement effect.

EXAMPLES

Examples of the present invention will be specifically described below, but the present invention is not limited to the Examples below.

[Measurement Method]

A thickness was determined by transmission electron microscope (TEM) observation of cross section. It is difficult to identify the interface between an intrinsic silicon-based layer and a conductive silicon-based layer by TEM observation. Thus, the thickness of each of these layers was calculated from a ratio of the total thickness of the layers determined from TEM observation and the deposition period. For a layer formed on a textured silicon substrate surface, a direction perpendicular to the slope of the texture was determined to be a thickness direction. The output characteristics of a solar cell were evaluated with using a solar simulator.

In each of examples below, an n-type single-crystalline silicon substrate having a light-incident surface direction identical to the (100) surface and having a thickness of 200 µm was used. The substrate surface was washed and then textures were formed on the substrate surface by anisotropic etching. Sizes of textures formed on the substrate were changed by changing kind of additive for anisotropic etching and/or conditions for anisotropic etching. In the washing performed before the anisotropic etching, the substrate was washed in acetone, and then immersed in an aqueous HF solution with a concentration of 2% by weight for 3 minutes to remove a silicon oxide covering on the surface, and thereafter rinsed twice with ultrapure water. After the anisotropic etching, the substrate was rinsed twice with ultrapure water.

Reference Example 1

In Reference Example 1, the crystalline silicon-based solar cell schematically shown in FIG. 1 was prepared by the following method.

A substrate with textures formed on a surface thereof was immersed for 10 minutes in an aqueous solution having an ozone concentration of 15 ppm and held at 25° C., and was then immersed for 2 minutes in a 2 wt % HF aqueous solution held at 25° C.

Figure 3:
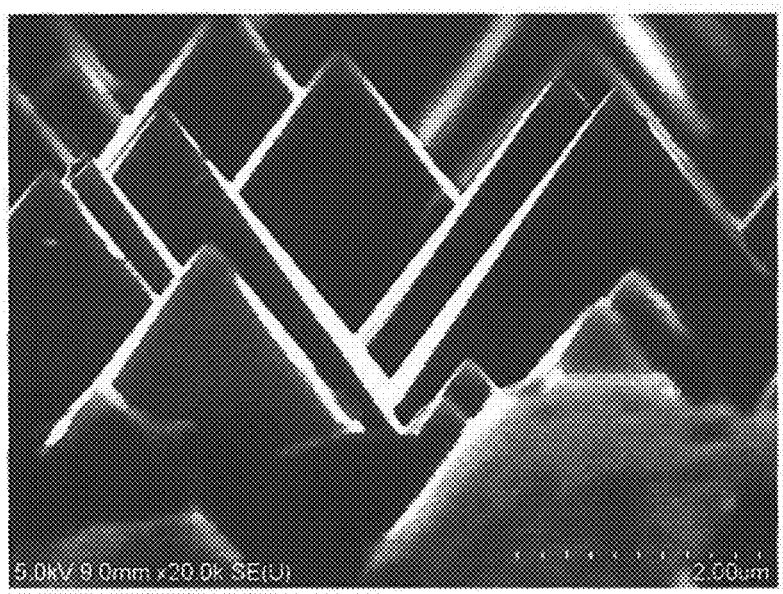
FIG. 3 is a scanning electron microscope image of single-crystalline silicon substrate surface according to one or more embodiments of the present invention.

A surface of a single-crystalline silicon substrate 1 was observed with an atomic force microscope (AFM manufactured by Pacific Nanotechnology Co., Ltd.). Progress of etching on the substrate surface was confirmed and pyramid-shaped textures exposed at the (111) surface were formed. As shown in FIG. 2, peaks T1 and T2 of projection portions and a valley V1 in textures were selected, and based on a sectional view taken along a line passing through the peaks T1 and T2, a height difference H1 in textures of the silicon substrate (size of the texture) was calculated. The height difference H1 was 3 µm. A curvature radius r of the recess portion of the texture was determined by observation with a transmission electron microscope (TEM). The curvature radius r was 2 nm. FIG. 3 shows a scanning electron microscope image of the silicon substrate.

Thereafter, the single-crystalline silicon substrate 1 was introduced into a CVD device, and a first intrinsic amorphous silicon layer 2 was deposited to have a thickness of 8 nm on one surface of the substrate (incident surface side). Deposition conditions included a substrate temperature of 150° C., a pressure of 120 Pa, a $SiH_4/H_2$ flow ratio of 3/10 and a high-frequency power density of 0.011 W/cm². On the first intrinsic amorphous silicon layer 2, a p-type amorphous silicon layer 3 was deposited to have a thickness of 10 nm. Deposition conditions of the p-type amorphous silicon layer 3 included a substrate temperature of 150° C., a pressure of 60 Pa, a $SiH_4$/diluted $B_2H_6$ gas flow ratio of 1/3 and a high-frequency power density of 0.011 W/cm². A diluted gas, wherein $B_2H_6$ concentration was diluted to 5000 ppm with $H_2$, was used as the diluted $B_2H_6$ gas.

On the other surface (back side) of the single-crystalline silicon substrate 1, a second intrinsic amorphous silicon layer 4 was deposited to have a thickness of 8 nm. Deposition conditions of the second intrinsic amorphous silicon layer 4 were identical to those of the first intrinsic amorphous silicon layer 2. On the second intrinsic amorphous silicon layer 4, an n-type amorphous silicon layer 5 was deposited to have a thickness of 10 nm. Deposition conditions of the n-type amorphous silicon layer 5 included a substrate temperature of 150° C., a pressure of 60 Pa, a $SiH_4$/diluted $PH_3$ gas flow ratio of 1/2 and a high-frequency power density of 0.011 W/cm². A diluted gas, wherein $PH_3$ concentration was diluted to 5000 ppm with $H_2$, was used as the diluted $PH_3$ gas.

Indium-tin complex oxide (ITO) layers each having a thickness of 100 nm were deposited as a first transparent electroconductive layer 6 and a second transparent electroconductive layer 8 on the surfaces of the p-type amorphous silicon layer 3 and the n-type amorphous silicon layer 5, respectively. For the deposition of ITO, a complex sintered compact of an indium oxide and a tin oxide (containing 5% by weight of tin oxide) was used as a target. Argon was introduced at 100 sccm as a carrier gas, and deposition was carried out under conditions including a substrate temperature of an ambient temperature, a pressure of 0.2 Pa and a high-frequency power density of 0.5 W/cm².

On the surfaces of the transparent electroconductive layers 6 and 8, a silver paste was screen-printed as collecting electrodes 7 and 9, respectively. Thereafter, a heat treatment was carried out at 150° C. under an atmospheric pressure for 60 minutes to solidify the silver paste, so that comb-like pattern collecting electrodes were formed. The interval between the collecting electrodes was set at 10 mm.

Example 1

By the same method as in Reference Example 1, textures were formed on a surface of an n-type single-crystalline silicon substrate, and an ozone treatment and a hydrofluoric acid treatment were then performed.

Subsequently, a single-crystalline silicon substrate 1 was introduced into a CVD device, and on one surface (incident side) thereof, a part of a first intrinsic amorphous silicon layer 2 was deposited to have a thickness of 4 nm. After the deposition, plasma discharge was stopped temporarily, and supply of $SiH_4$ was stopped. Only hydrogen gas was introduced into the CVD device for about 30 seconds to replace the gas in the device. Thereafter, plasma discharge was resumed to carry out a hydrogen plasma treatment. Conditions for the hydrogen plasma treatment included a substrate temperature of 150° C., a pressure of 120 Pa, a high-frequency power density of 0.026 W/cm² and a treatment time of 60 seconds. Thereafter, supply of $SiH_4$ was resumed, and a supplementary part of the first intrinsic amorphous silicon layer 2 was then deposited to have a thickness of 4 nm. Deposition conditions for forming the first intrinsic amorphous silicon layer 2 were the same as those in the Reference Example 1.

On the other surface (back side) of the single-crystalline silicon substrate 1, a part of a second intrinsic amorphous silicon layer 4 was deposited to have a thickness of 4 nm, a hydrogen plasma treatment was performed, and a supplementary part of the second intrinsic amorphous silicon layer 4 was then deposited to have a thickness of 4 nm. Conditions for the hydrogen plasma treatment were identical to those on the incident side. Except that the hydrogen plasma treatment was performed, the same procedure as in Reference Example 1 was carried out to prepare a crystalline silicon-based solar cell.

Reference Example 2

Figure 4:
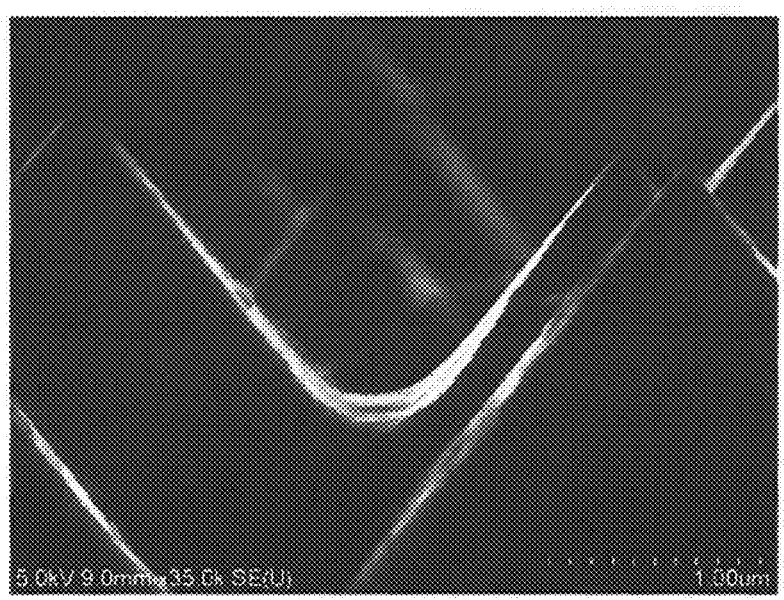
FIG. 4 is a scanning electron microscope image of single-crystalline silicon substrate surface according to one or more embodiments of the present invention.

In the same manner as in Reference Example 1, textures were formed on a substrate surface by anisotropic etching. An aqueous solution obtained by mixing a 50 wt % HF aqueous solution and a 60 wt % nitric acid aqueous solution at a volume ratio of 1:20 was provided, and the substrate provided with textures was immersed for 30 seconds in the mixed aqueous solution held at 25° C. Thereafter, an ozone treatment and a hydrofluoric acid treatment were performed in the same manner as in Reference Example 1. The textures on the silicon substrate had a size of 3 μm, and the recess portions of the textures had a curvature radius r of 200 nm. FIG. 4 shows a scanning electron microscope image of the silicon substrate. Using this silicon substrate, a crystalline silicon-based solar cell was prepared in the same manner as in Reference Example 1.

Comparative Example 1

Except that a hydrogen plasma treatment was performed under conditions identical to those in Example 1, the same procedure as in Reference Example 2 was carried out to prepare a crystalline silicon-based solar cell.

Reference Example 3

Conditions for anisotropic etching were changed to form, on a substrate surface, textures having a larger size as compared to the textures in Reference Example 1. The substrate provided with textures was subjected to an ozone treatment and a hydrofluoric acid treatment in the same manner as in Reference Example 1. The textures on the silicon substrate after the treatment had a size of 5 μm, and the recess portions of the textures had a curvature radius r of 2 nm. Using this silicon substrate, a crystalline silicon-based solar cell was prepared in the same manner as in Reference Example 1.

Reference Example 4

In the same manner as in Reference Example 3, textures were formed on a substrate surface by anisotropic etching. In the same manner as in Reference Example 2, the substrate provided with textures was subjected to a hydrofluoric acid and nitric acid aqueous solution treatment, and an ozone treatment and a hydrofluoric acid treatment were performed thereafter. The textures on the silicon substrate after the treatment had a size of 5 μm, and the recess portions of the textures had a curvature radius r of 200 nm. Using this silicon substrate, a crystalline silicon-based solar cell was prepared in the same manner as in Reference Example 1.

Reference Example 5

Conditions for anisotropic etching were changed to form, on a substrate surface, textures having a larger size as compared to the textures in Reference Example 3. The substrate provided with textures was subjected to an ozone treatment and a hydrofluoric acid treatment in the same manner as in Reference Example 1. The textures on the silicon substrate after the treatment had a size of 10 μm, and the recess portions of the textures had a curvature radius r of 2 nm. Using this silicon substrate, a crystalline silicon-based solar cell was prepared in the same manner as in Reference Example 1.

Comparative Example 2

Except that a hydrogen plasma treatment was performed under conditions identical to those in Example 1, the same procedure as in Reference Example 5 was carried out to prepare a crystalline silicon-based solar cell.

Reference Example 6

In the same manner as in Reference Example 5, textures were formed on a substrate surface by anisotropic etching. In the same manner as in Reference Example 2, the substrate provided with textures was subjected to a hydrofluoric acid and nitric acid aqueous solution treatment, and an ozone treatment and a hydrofluoric acid treatment were performed thereafter. The textures on the silicon substrate after the treatment had a size of 10 μm, and the recess portions of the textures had a curvature radius r of 200 nm. Using this silicon substrate, a crystalline silicon-based solar cell was prepared in the same manner as in Reference Example 1.

Comparative Example 3

Except that a hydrogen plasma treatment was performed under conditions identical to those in Example 1, the same procedure as in Reference Example 6 was carried out to prepare a crystalline silicon-based solar cell.

The results of evaluating the photoelectric conversion characteristics of the solar cells of Examples, Reference Examples and Comparative Examples by using a solar simulator are shown in Table 1. In Table 1, values normalized with Reference Example 1 as a reference are shown in addition to measured values of the photoelectric conversion characteristics (open circuit voltage, short circuit current, fill factor and conversion efficiency).

TABLE 1

| | silicon substrate texture | | | solar cell photoelectric conversion characteristics | | | | | | | |
|---|---|---|---|---|---|---|---|---|---|---|---|
| | | | hydrogen | measured value | | | | normalized value | | | |
| | size | curvature radius of recess portion | plasma | Voc | Isc | FF | Eff | | | | |
| | (μm) | (nm) | treatment | (mV) | (mA) | (%) | (%) | Voc | Isc | FF | Eff |
| Reference Example 1 | 3 | 2 | None | 723 | 37.3 | 77.6 | 20.9 | 1 | 1 | 1 | 1 |
| Example 1 | | | Done | 738 | 37.3 | 79.2 | 21.8 | 1.021 | 1.000 | 1.021 | 1.042 |
| Reference Example 2 | 3 | 200 | None | 724 | 36.1 | 77.6 | 20.3 | 1.001 | 0.968 | 1.000 | 0.969 |
| Comparative Example 1 | | | Done | 729 | 36.1 | 78.0 | 20.5 | 1.008 | 0.968 | 1.005 | 0.981 |
| Reference Example 3 | 5 | 2 | None | 718 | 37.0 | 77.2 | 20.5 | 0.993 | 0.992 | 0.995 | 0.980 |
| Reference Example 4 | 5 | 200 | No | 724 | 36.3 | 77.7 | 20.4 | 1.001 | 0.973 | 1.001 | 0.976 |

TABLE 1-continued

| | silicon substrate texture | | | solar cell photoelectric conversion characteristics | | | | | | | |
|---|---|---|---|---|---|---|---|---|---|---|---|
| | curvature radius | hydrogen | measured value | | | | normalized value | | | |
| | size | of recess portion | plasma | Voc | Isc | FF | Eff | Voc | Isc | FF | Eff |
| | (μm) | (nm) | treatment | (mV) | (mA) | (%) | (%) | | | | |
| Reference Example 5 | 10 | 2 | None | 713 | 36.8 | 77.1 | 20.2 | 0.986 | 0.987 | 0.994 | 0.967 |
| Comparative Example 2 | | | Done | 714 | 36.8 | 77.1 | 20.3 | 0.988 | 0.987 | 0.994 | 0.968 |
| Reference Example 8 | 10 | 200 | none | 724 | 36.5 | 77.6 | 20.5 | 1.001 | 0.979 | 1.000 | 0.980 |
| Comparative Example 3 | | | Done | 722 | 36.5 | 77.7 | 20.5 | 0.999 | 0.979 | 1.001 | 0.978 |

Reference Example 6 provides a solar cell obtained by the method described in Japanese Patent Publication No. 3271990 (Patent Document 1). In Reference Example 6, a treatment for rounding the recess portions of textures (HF/HNO$_3$ treatment) was performed. Therefore as compared to Reference Example 5 in which a treatment for rounding recess portions was not performed, open circuit voltage and fill factor were improved and short circuit current was reduced in Reference Example 6. Conversion efficiency in Reference Example 6 was higher as compared to Reference Example 5. The reason why short circuit current was reduced in Reference Example 6 may be that the treatment for rounding the recess portions of textures increased the curvature radius of the recess portion, leading to an increase in reflectivity.

From comparison with Reference Example 3 and Reference Example 4 in which the texture size is 5 μm, it is apparent that open circuit voltage and fill factor tend to be improved and short circuit current density tends to be reduced when a treatment for rounding the recess portions of textures is performed. Comparison with Reference Example 1 and Reference Example 2 in which the texture size is 3 μm shows that open circuit voltage and fill factor are not evidently improved even when a treatment for rounding the recess portions of textures is performed. On the other hand, short circuit current density is reduced by about 3% with the treatment. Thus, in Reference Example 1 in which a treatment for rounding textures was not performed, conversion efficiency was increased by about 3% as compared to Reference Example 2.

Comparison of Reference Example 2, Reference Example 4 and Reference Example 6 in which a treatment for rounding the recess portions of textures was performed showed that while there was almost no difference in open circuit voltage and fill factor irrespective of the texture size, short circuit current tended to be reduced as the texture size decreased. On the other hand, in Reference Example 1, Reference Example 3 and Reference Example 5 in which a treatment for rounding the sizes of textures was not performed, all of open circuit voltage, fill factor and short circuit current tended to be increased as the texture size decreased.

From these results, it is apparent that by combining the feature that the recess portions of textures before deposition of the intrinsic silicon-based layer are not excessively rounded (the curvature radius is small) and the feature that textures are small, a reduction in open circuit voltage and fill factor can be suppressed, and short circuit current can be improved, so that a solar cell having high conversion efficiency can be prepared.

In Comparative Example 2 and Comparative Example 3 in which the texture size was 10 μm, the conversion characteristic was not improved as compared to Reference Example 5 and Reference Example 6 in which a hydrogen plasma treatment was not performed. On the other hand, in Example 1 and Comparative Example 1 in which the texture size was 3 μm, a hydrogen plasma treatment was performed, so that open circuit voltage and fill factor were improved as compared to Reference Example 1 and Reference Example 2.

From comparison with Comparative Example 1 and Reference Example 2 in which a treatment for rounding the recess portions of textures was performed, it is apparent that conversion efficiency was improved by about 1% by the hydrogen plasma treatment. On the other hand, comparison between Example 1 and Reference Example 1 in which a treatment for rounding the recess portions of textures was not performed shows that conversion efficiency was improved by 4% or more by the hydrogen plasma treatment.

From these results, it can be understood that use of a silicon substrate which is provided with textures small in size by anisotropic etching, and then surface-cleaned using ozone without being subjected to a treatment for rounding the recess portions of the textures considerably improves the effect of improving open circuit voltage and fill factor by hydrogen plasma treatment of an intrinsic silicon-based layer, so that a crystalline silicon-based solar cell having high conversion efficiency is obtained.

DESCRIPTION OF REFERENCE CHARACTERS

1 single-crystalline silicon substrate
2, 4 intrinsic silicon-based layer
3 p-type silicon-based layer
5 n-type silicon-based layer
6, 8 transparent electroconductive layer
7, 9 collecting electrode Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

The invention claimed is:
1. A method for manufacturing a crystalline silicon-based solar cell, the method comprising:
  forming a texture on a surface of a single-crystalline silicon substrate;

cleaning the surface of the single-crystalline silicon substrate using ozone;

depositing an intrinsic silicon-based layer on the texture on the single-crystalline silicon substrate; and depositing a conductive silicon-based layer on the intrinsic silicon-based layer, wherein a recess portion of the texture prior to the depositing the intrinsic silicon-based layer has a curvature radius of less than 5 nm and a size of the texture prior to the depositing the intrinsic silicon-based layer is less than 5 μm, and after the depositing at least a part of the intrinsic silicon-based layer and before the depositing the conductive silicon-based layer, the intrinsic silicon-based layer is subjected to a plasma treatment in an atmosphere of a gas comprising hydrogen.

2. The method according to claim 1, wherein the crystalline silicon-based solar cell comprises the single-crystalline silicon substrate, and the intrinsic silicon-based layer, the conductive silicon-based layer, and a transparent electroconductive layer are layered on the surface of the single-crystalline silicon substrate.

3. A method for manufacturing a crystalline silicon-based solar cell, the method comprising:

forming a texture on a surface of a single-crystalline silicon substrate by anisotropic etching;

cleaning the surface of the single-crystalline silicon substrate using ozone; and depositing an intrinsic silicon-based layer on the texture on the single-crystalline silicon substrate, depositing a conductive silicon-based layer on the intrinsic silicon-based layer, wherein an isotropic etching treatment for rounding a recess portion of the texture is not performed between the forming the texture and the cleaning the surface of the single-crystalline silicon substrate using ozone, a size of the texture prior to the depositing the intrinsic silicon-based layer is less than 5 μm, and after the depositing at least a part of the intrinsic silicon-based layer and before the depositing the conductive silicon-based layer, the intrinsic silicon-based layer is subjected to a plasma treatment in an atmosphere of a gas comprising hydrogen.

4. The method according to claim 3, wherein the crystalline silicon-based solar cell comprises the single-crystalline silicon substrate, and the intrinsic silicon-based layer, the conductive silicon-based layer, and a transparent electroconductive layer are layered on the surface of the single-crystalline silicon substrate.

5. A method for manufacturing a solar cell module, comprising:

manufacturing a plurality of crystalline silicon-based solar cells by the method according to claim 1;

connecting the plurality of the crystalline silicon-based solar cells; and sealing the crystalline silicon-based solar cells with a sealing material.

6. A method for manufacturing a solar cell module, comprising:

manufacturing a plurality of crystalline silicon-based solar cells by the method according to claim 3;

connecting the plurality of the crystalline silicon-based solar cells; and sealing the crystalline silicon-based solar cells with a sealing material.

7. The method according to claim 1, wherein the single-crystalline silicon substrate is an n-type single-crystalline silicon substrate.

8. The method according to claim 1, wherein the conductive silicon-based layer is an n-type silicon-based layer or a p-type silicon-based layer.

9. The method according to claim 1, wherein the curvature radius is less than 2.5 nm and the size of the texture is less than 3.5 μm.

10. The method according to claim 3, wherein the single-crystalline silicon substrate is an n-type single-crystalline silicon substrate.

11. The method according to claim 3, wherein the conductive silicon-based layer is an n-type silicon-based layer or a p-type silicon-based layer.

12. The method according to claim 3, wherein the size of the texture is less than 3.5 μm.

* * * * *